(12) United States Patent
Lee

(10) Patent No.: US 6,318,452 B1
(45) Date of Patent: Nov. 20, 2001

(54) CLIP FOR HEAT SINK

(75) Inventor: DongYun Lee, ShenZhen (CN)

(73) Assignee: Foxconn Precision - Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/613,106

(22) Filed: Jul. 10, 2000

(30) Foreign Application Priority Data

Mar. 15, 2000 (TW) .............................................. 089204147

(51) Int. Cl.[7] .................................................. H05K 7/20
(52) U.S. Cl. ...................... 165/80.3; 165/185; 174/16.3; 257/719; 361/704
(58) Field of Search ................................. 165/80.3, 185; 174/16.3; 257/719, 718; 361/704

(56) References Cited

U.S. PATENT DOCUMENTS

| | | | | |
|---|---|---|---|---|
| 5,638,258 | * | 6/1997 | Lin ........................................ | 361/704 |
| 5,791,403 | * | 8/1998 | Chiou .................................... | 165/80.3 |
| 5,828,553 | * | 10/1998 | Chiou .................................... | 361/704 |
| 5,860,195 | * | 1/1999 | Wang ................................. | 165/80.3 X |
| 5,943,209 | * | 8/1999 | Liu .................................... | 165/80.3 X |
| 5,953,212 | * | 9/1999 | Lee ..................................... | 361/704 X |
| 6,111,752 | * | 8/2000 | Huang et al. ......................... | 361/704 |
| 6,229,705 | * | 5/2001 | Lee ...................................... | 361/704 |
| 6,257,533 | * | 7/2001 | Pei et al. ............................ | 361/704 X |

* cited by examiner

Primary Examiner—Leonard Leo
(74) Attorney, Agent, or Firm—Wei Te Chung

(57) ABSTRACT

A clip includes a body (10) having a spring portion (12) and a leg (14) formed on a first end of the spring portion for engaging with a first side of a heat generating device, such as a central processing unit module. A fastener (20) has a spring plate (24) connected to a second end of the spring portion of the body and is engageable with an opposite second side of the heat generating device for securing a heat sink to the heat generating device. A pair of connecting tabs (26) extends from the fastener above the body for pivotally retaining an actuating member (30) therebetween. The actuating member forms cams (34) engaging the spring portion of the body whereby, when the actuating member is manually operated, the camming engagement between the actuating member and the spring portion drives the fastener to engage the second side of the heat generating device.

9 Claims, 5 Drawing Sheets

CLIP FOR HEAT SINK

BACKGROUND OF THE INVENTION

1. Field of the Invention

The present invention relates to a clip for a heat sink, and particularly to a lip which readily and securely attaches a heat sink to an electronic device.

2. The Related Art

A heat sink placed in contact with an electronic package, such as a central processing unit (CPU) module, transfers heat through conduction from the electronic package. Oftentimes, a heat sink is secured to an electronic package by a clip.

Referring to FIG. 5, a conventional clip comprises a first member 1 and a second member 2 coupled to the first member 1. The clip is placed on and secures a heat sink 20 to a CPU module 25 supported on a socket 90. The first member 1 includes a spring portion 3 with a leg 4 extending from an end of the spring portion 3. The leg 4 defines a first slot 6 for engaging with a catch 91 of the socket 90. A pair of arms 5 extends from an opposite end of the spring portion 3 to define a receiving space 7 for receiving the second member 2 therein. The second member 2, which is L-shaped, comprises a handle portion 8 extending above the spring portion 3 of the first member 1 for manual operation and a lower portion (not labeled) opposite the leg 4 defining a second slot 10 for engaging a catch 92 of the socket 90. The second member 2 defines a pair of notches 9 on opposite sides thereof for engaging with the arms 5 thereby connecting the first member 1 to the second member 2. The spring portion 3 is deformed to apply a spring force to the heat sink 20 for securing the heat sink 20 and the CPU module 25 to the socket 90.

However, a great force is required to operate the handle portion 8 for fixing the heat sink 20 to the CPU module 25. This makes it difficult to attach and detach the clip from the socket. Furthermore, the engagement between the second member 2 and the socket 90 may be unexpectedly broken due to external shocks applied to the heat sink 20 and/or the CPU module 25 whereby the heat sink 20 may become separated from the CPU module 25 and the socket 9.

SUMMARY OF THE INVENTION

Accordingly, an object of the present invention is to provide a clip which readily secures a heat sink to an electronic device.

Another object of the present invention is to provide a clip which securely attaches a heat sink to an electronic device.

To achieve the above-mentioned objects, a clip in accordance with the present invention comprises a body having a spring portion and a leg formed on a first end of the spring portion for engaging with a first side of a heat generating device, such as a central processing unit module. A fastener has a spring plate connected to a second end of the spring portion of the body for being engageable with an opposite second side of the heat generating device to secure a heat sink to the heat generating device. A pair of connecting tabs extends from the fastener above the body for pivotally retaining an actuating member. The actuating member forms cams engaging the spring portion of the body whereby when the actuating member is manually operated, the camming engagement between the actuating member and the spring portion drives the fastener to engage the second side of the heat generating device.

Other objects, advantages and novel features of the present invention will be drawn from the following detailed description of preferred embodiments thereof with reference to the attached drawings, in which:

DESCRIPTION OF THE PREFERRED EMBODIMENTS

Figure 1:
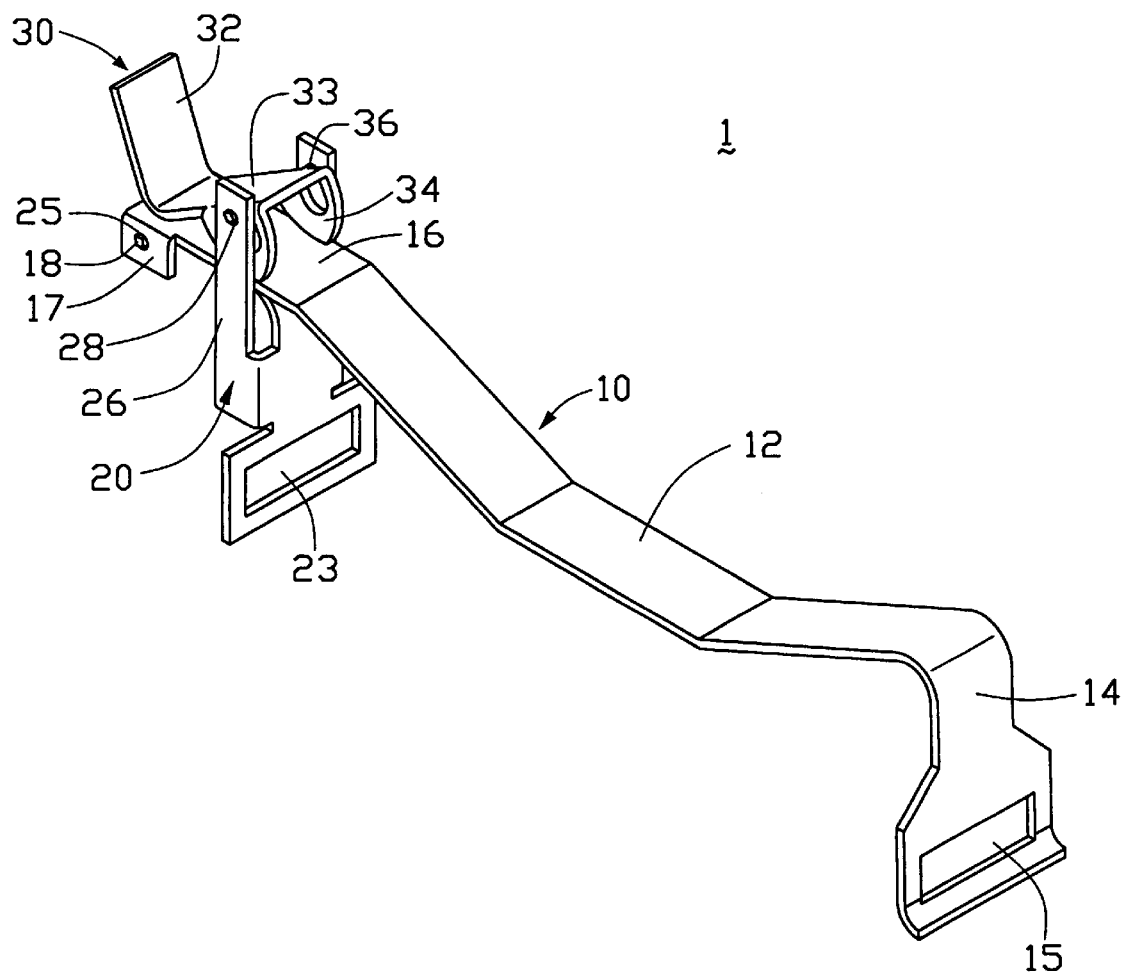
FIG. 1 is a perspective view of a clip constructed in accordance with the present invention.
Figure 2:
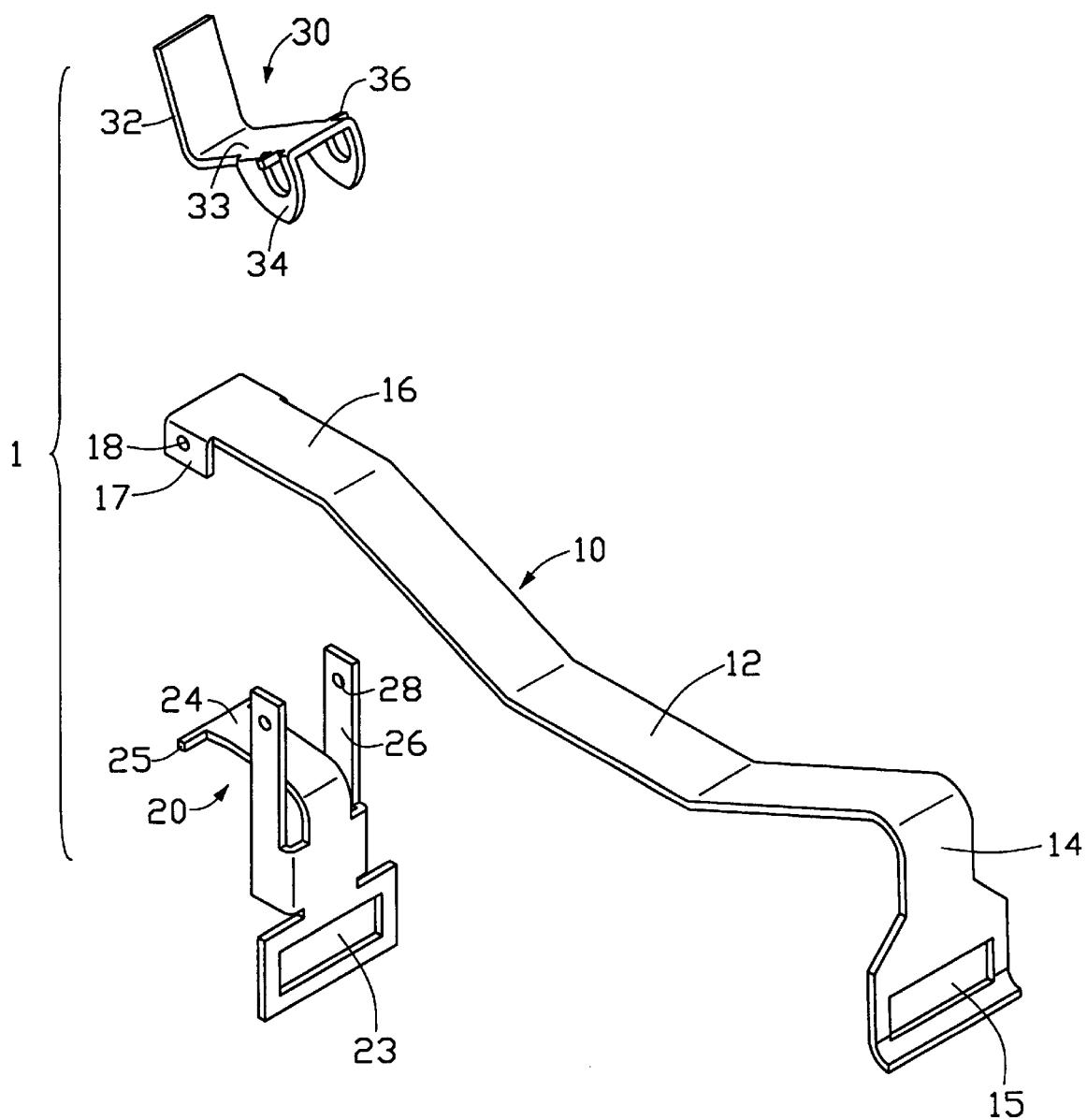
FIG. 2 is an exploded view of FIG. 1.
Figure 3:
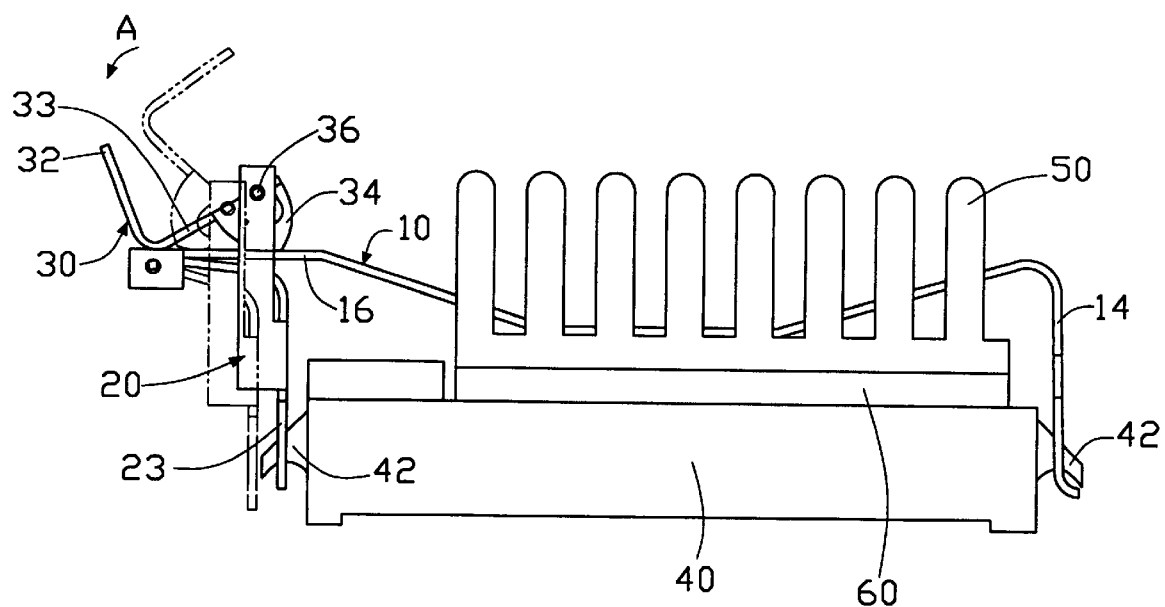
FIG. 3 is a schematic side elevational view of the clip of the present invention securing a heat sink onto an electronic device.

As shown in FIGS. 1–3, a clip 1 of the present invention comprises a body 10, a fastener 20 and an actuating member 30. The body 10 has a spring portion 12 positionable on a heat sink 50 for forcing the heat sink 50 against a central processing unit (CPU) module 60 supported on a socket 40. A leg 14 extends from an end of the spring portion 12. A first slot 15 is defined in the leg 14 for receiving a catch 42 of the socket 40. A connecting portion 16 extends from a free end of the spring portion 12. A pair of flanges 17 defining a pair of aligned first holes 18 extends perpendicularly from opposite edges of the connecting portion 16.

The fastener 20 defines a second slot 23 corresponding to and engageable with another catch 42 of the socket 40. A pair of connecting tabs 26 defining a pair of aligned second holes 28 is stamped on opposite edges of the fastener 20. A spring plate 24 extends between the connecting tabs 26. A pair of first pins 25 extends from opposite edges of the spring plate 24 for being received in the first holes 18 of the body 10.

The actuating member 30 is generally L-shaped and comprises a base 33 and a handle lever 32 perpendicularly extending from the base 33. A pair of cams 34 extends from opposite sides of the base 33 opposite the handle lever 32. A pair of second pins 36 extends from opposite sides of the base 33 for being pivotally received in the second holes 28 of the fastener 20.In assembly of the clip 1, the fastener 20 is positioned under the connecting portion 16 of the body 10 with the spring plate 24 of the fastener 20 abutting against the connecting portion 16 and the first pins 25 of the fastener 20 received in the first holes 18 of the flanges 17 to attach the fastener 20 to the body 10. The connecting tabs 26 of the fastener 20 are dimensioned to extend above the connecting portion 16 of the body 10. The actuating member 30 is positioned above the connecting portion 16 of the body 10 between the connecting tabs 26 of the fastener 20 with the second pins 36 pivotally received in the second holes 28 of the connecting tabs 26 and the cams 34 contacting the connecting portion 16 opposite to the spring plate 24 of the fastener 20.

Especially referring to FIG. 3, the clip 1 is positioned on the heat sink 50 supported on the CPU module 60 and the socket 40 with the first slot 15 of the leg 14 thereof engaging with the catch 42 of the socket 40. The handle lever 32 of the actuating member 30 is rotated in direction A about the second pins 36 from a released position (shown in dashed lines in FIG. 3) to a locked position (shown in solid lines in FIG. 3) where the second slot 23 of the fastener 20 engages with another catch 42 of the socket 40. During the rotation of the actuating member 30, camming surfaces of the cams 34 act upon the connecting portion 16 of the body 10. The camming surfaces are configured to cause the connecting portion 16 to move downward, leading to deflection of the spring plate 24 and driving the second slot 23 toward the corresponding catch 42. The distance between the handle lever 32 and the second pins 36 is made longer than an average radius of the cams 34 whereby a relatively small force is required to drive the cams 34 for engaging the fastener 20 with the catch 42 of the socket 40. Thus, the clip 1 readily secures the heat sink 50 to the CPU module 60 and the socket 40.

When the handle lever 32 of the actuating member 30 is rotated reversely from the locked position to the released position, the cams 34 release the connecting portion 16 of the body 10 and the spring plate 24 of the fastener 20 drives the connecting portion 16 in opposite direction back to its original position. The fastener 20 is then moved downwardly and disengages from the catch 42 of the socket 40. The body 10 of the clip 1 is then easily disengaged from the catch 42 of the socket 40 for disassembling the heat sink 50 from the CPU 60.

It is noted that the actuating member 30 is configured so that when the actuating member 30 is moved to the locked position, a connecting bend between the handle lever 32 and the base 33 abuts against the connecting portion 16 of the body 10 on one side of the connecting tabs 26 while the contact points between the cams 34 and the connecting portion are located on an opposite side of the connecting tabs 26, as shown in FIG. 3. This prevents the actuating member 30 from being unexpectedly released due to external shocks applied to the socket 40 or the clip 1 itself.

Figure 5:
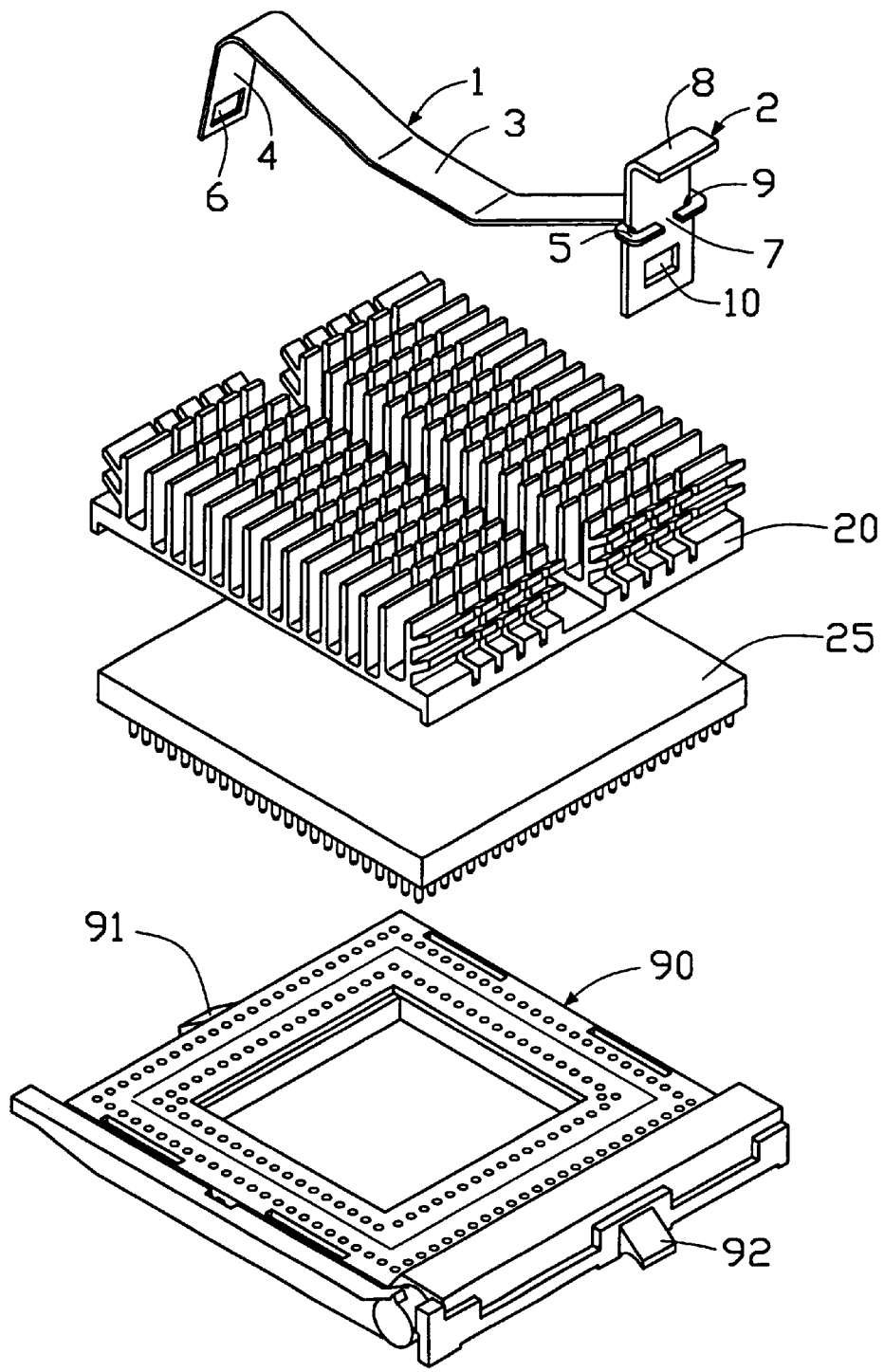
FIG. 5 is an exploded view of a conventional clip securing a heat sink and a CPU module to a socket.

It can be noted that in comparison with the conventional clip as shown in FIG. 5, the additional element, i.e., the actuating member 30, may assure the reliable locking engagement between the fastener 20 of the clip 1 and the catch 42 of the socket 40. Understandably, the fastener 20 may be actuated to move up and down, either rotatably or slidably, relative to the spring portion 12 of the clip 1 or the socket 40, so as to latch or unlatch the clip to or from the socket 40.

Figure 4:
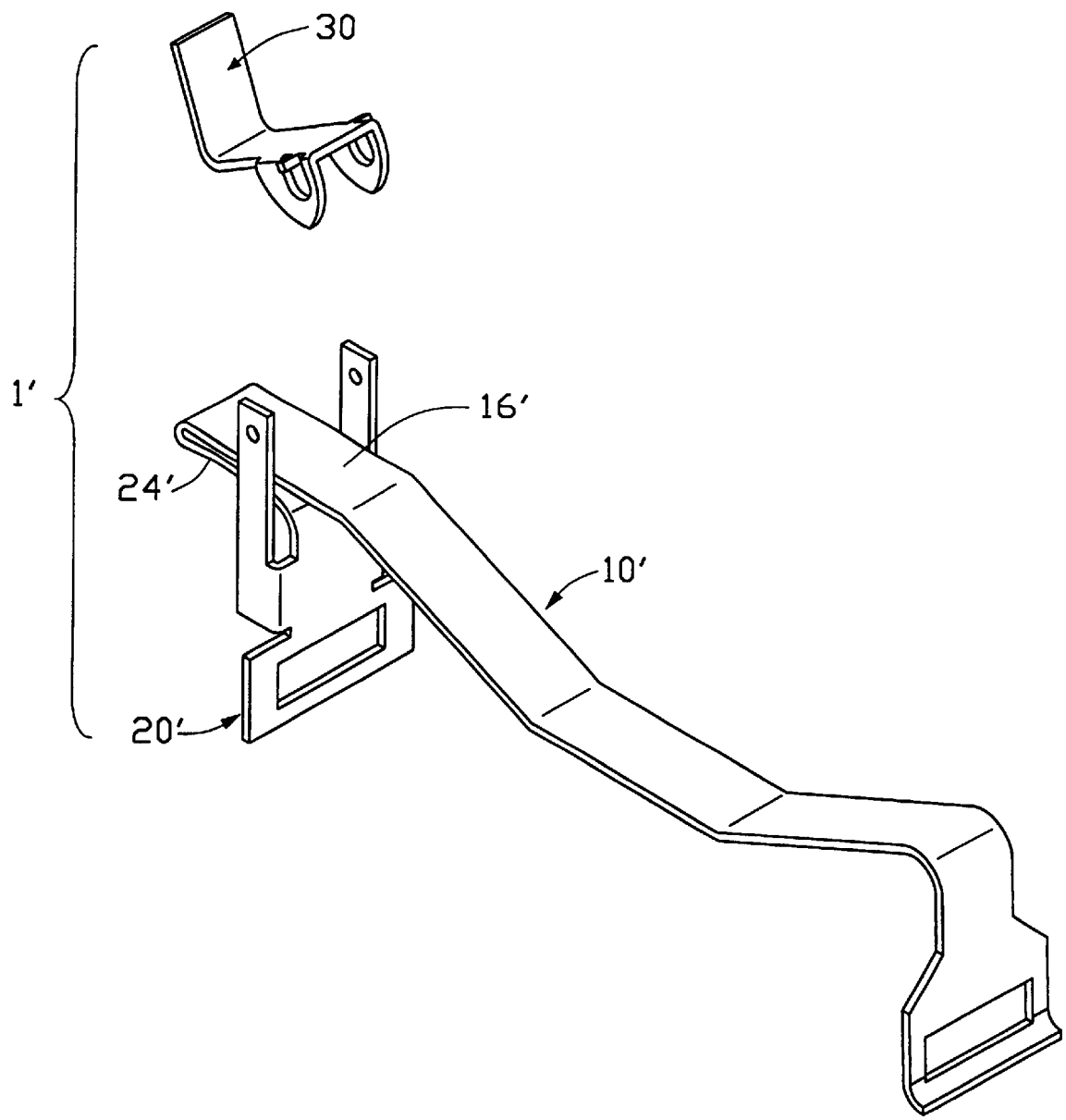
FIG. 4 is an exploded view of a clip constructed in accordance with another embodiment of the present invention.

FIG. 4 illustrates a clip 1' constructed in accordance with another embodiment of the present invention. The clip 1' is substantially the same as the clip 1 discussed with reference to FIGS. 1–3. The clip 1' includes a body 10', a fastener 20' integrally extending from the body 10', and an actuating member 30. The fastener 20' forms a spring plate 24' extending from a connecting portion 16' of the body 10'. The operation of the clip 1' is substantially the same as the clip 1 and thus further description is not necessary.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip adapted to secure a heat sink to a heat generating device comprising:
    a body comprising a spring portion and a leg extending from an end of the spring portion for engaging a first side of the heat generating device, a connecting portion being formed on an opposite end of the spring portion;
    a fastener comprising a spring plate coupled to the connecting portion of the body, a pair of connecting tabs extending upwardly from opposite edges of the fastener above the connecting portion; and
    an actuating member pivotally attached to the connecting tabs on an opposite side of the connecting portion from the spring plate, camming means formed on the actuating member for cammingly acting upon the connecting portion of the body to move the fastener toward and thus engage the fastener with a second side of the heat generating device.

2. The clip as claimed in claim 1, wherein the fastener integrally extends from the connecting portion of the body.

3. The clip as claimed in claim 1, wherein the connecting portion forms opposite flanges defining aligned first holes for receiving a pair of first pins formed on the spring plate of the fastener to couple the fastener to the flanges.

4. The clip as claimed in claim 1, wherein the actuating member forms a pair of second pins for being pivotally received in second holes defined in the connecting tabs of the fastener to allow the actuating member to move with respect to the connecting portion of the body between a released position and a locked position.

5. The clip as claimed in claim 4, wherein the actuating member is L-shaped, comprising a base and a handle lever perpendicularly extending from the base and forming a connecting bend between the handle lever and the base, the camming means being configured such that, when the actuating member is at the locked position, the connecting bend and the contact point of the camming means with the connecting portion each abut the connecting portion on opposite sides of the connecting tabs of the fastener.

6. The clip as claimed in claim 1, wherein the actuating member is L-shaped, comprising a base and a handle lever perpendicularly extending from the base, the camming means being formed on the base and in contact with the connecting portion of the body.

7. A heat sink assembly comprising:
    a socket with a catch thereon;
    a heat sink positioned on the socket;
    a clip fastening the heat sink to the socket, said clip including:
        a body including an elongated spring portion abutting against the heat sink;
        a fastener coupled to one end of said spring portion and defining a locking slot latchably receiving the catch; and
        a pivotal actuating member positioned around said end of said spring portion, said actuating member being not integrally formed with said fastener and said body while connecting to said fastener; wherein
        said fastener is actuated to move up and down by said actuating member to latch or unlatch the clip to or from the socket.

8. The assembly as claimed in claim 7, wherein said fastener is positioned under the spring portion while the actuating member is positioned above the spring portion.

9. A clip for use with a heat sink, comprising:
    an elongated spring portion with at one end a leg defining a first locking slot;
    a fastener coupled to the other end of the spring portion, said fastener defining a second locking slot opposite to said first locking slot; and
    an independent actuating member positioned around said other end of the spring portion, said actuating member including means for connecting to the fastener and means for engaging the spring portion; wherein
    said fastener is moved up and down relative to the spring portion via moving said actuating member.

* * * * *